United States Patent
Leichsenring et al.

(10) Patent No.: US 6,576,396 B1
(45) Date of Patent: Jun. 10, 2003

(54) STABLE PIGMENT DISPERSION AND PHOTOSENSITIVE RECORDING MATERIAL PREPARED THEREWITH

(75) Inventors: Thomas Leichsenring, Mainz (DE); Thorsten Lifka, Bad Schwalbach (DE); Armin Pink, Hofheim (DE); Klaus-Peter Konrad, Gensingen (DE); Hans-Joachim Schlosser, Wiesbaden-Naurod (DE)

(73) Assignee: Agfa-Gevaert (BE)

( * ) Notice: Subject to any disclaimer, the term of this patent is extended or adjusted under 35 U.S.C. 154(b) by 0 days.

(21) Appl. No.: 09/619,073

(22) Filed: Jul. 17, 2000

(30) Foreign Application Priority Data

Jul. 19, 1999 (DE) .......................... 199 33 139

(51) Int. Cl.$^7$ ............................................. G03F 7/021
(52) U.S. Cl. ................. 430/270.1; 430/281.1; 430/286.1; 430/176; 524/425; 525/57
(58) Field of Search ............ 524/425; 525/57; 430/270.1, 281.1, 286.1

(56) References Cited

U.S. PATENT DOCUMENTS

| | | | | |
|---|---|---|---|---|
| 3,615,403 A | * | 10/1971 | Cheng | ........................ 430/63 |
| 4,818,783 A | | 4/1989 | Shioji et al. | ................ 524/425 |
| 6,100,004 A | * | 8/2000 | Elsaesser et al. | ........... 430/176 |
| 6,462,125 B1 | * | 10/2002 | White et al. | ................ 524/560 |
| 2002/0193514 A1 | * | 12/2002 | Wang et al. | ................ 524/853 |

FOREIGN PATENT DOCUMENTS

| | | |
|---|---|---|
| DE | 19713590 | 10/1998 |
| EP | 672 542 | 9/1995 |
| EP | 695971 | 2/1996 |
| EP | 784 085 | 7/1997 |
| GB | 1178839 | 1/1970 |
| GB | 147 555 3 | 6/1977 |
| JP | 4179954 | 6/1992 |
| JP | 5239395 | 9/1993 |
| JP | 5331395 | 12/1993 |
| JP | 5333551 | 12/1993 |
| SU | 1423568 | 9/1988 |
| WO | WO 9904981 | 2/1999 |

* cited by examiner

Primary Examiner—Rosemary Ashton
Assistant Examiner—Yvette C. Thornton
(74) Attorney, Agent, or Firm—Connolly Bove Lodge & Hutz LLP

(57) ABSTRACT

The invention relates to a pigment dispersion which contains at least one polymer containing polyvinyl alcohol, polyvinyl ether an/or polyvinyl acetal units and at least one polymer based on acrylate, wherein the weight ratio is generally 1:10 to 10:1, preferably 4:1 to 1:4. This dispersion is used in positive- or negative-working and reversible photosensitive mixtures for the preparation of recording materials.

26 Claims, No Drawings

STABLE PIGMENT DISPERSION AND PHOTOSENSITIVE RECORDING MATERIAL PREPARED THEREWITH

The present invention relates to a dispersed coloured pigment and a photosensitive mixture containing the dispersed coloured pigment. The present invention also relates to a photosensitive recording material comprising a support and a layer of the mixture. The recording material is meant in particular for the preparation of lithographic printing plates.

Recording materials comprising a coloured photosensitive layer are known. As a result of the colouring, coating defects that may arise in the preparation of the materials are more readily identifiable. The visibility of the image arising in development is also better. (Insoluble) coloured pigments are generally used for the colouring, but not (soluble) dyes. Dyes almost always influence photoreactions that take place during the image-wise exposure of the recording material, and consequently give rise to an undesirable change in sensitivity. Coloured pigments, on the other hand, largely behave inertly and do not change the sensitivity. Their proportion in the photosensitive layer is therefore not particularly limited either and may vary within wide limits. However, if they are dispersed, together with the other constituents of a photosensitive mixture, in an organic solvent, they tend to agglomerate, leading to coating defects. The pigments are frequently also precipitated out of the coating liquid and form a sediment. The coating liquids are then only stable for a very short time and have to be processed almost immediately. In order to improve storage stability, the pigments according to WO 82/02780 are dispersed with substantially amorphous polyesters, which contain anionic groups. The viscosity of the pigment dispersion is additionally reduced by the dispersion with the polyesters. However, the anionic groups also give rise to increased solubility in water. Printing plates that contain such dispersed pigments in their printing layer therefore show a reduced print run, especially in wet offset printing.

The object of EP-A 695 971 is a photosensitive recording material for the preparation of lithographic printing plates, the photosensitive layer of which contains a coloured pigment dispersed in a polymerisable compound. Dispersion of the pigment takes place in the presence of a polymer containing (at least) one aliphatic double bond in the main chain or side chain, for example of an allyl methacrylate/ methacrylic acid copolymer. Higher sensitivity of the recording material is additionally to be achieved by dispersion containing the special polymer. However, the said polymers are generally less stable in storage and only sufficient in highly alkaline (pH 12.5) aqueous developers, but still not readily soluble. As they are in addition relatively soft, they are not particularly suitable for long-run printing plates.

The recording material developable with water according to EP-A 738 931 contains in the photosensitive layer a polyvinyl alcohol, a diazo compound or a diazonium salt, a cationic surfactant and a metal-free phthalocyanine pigment. The pigment is pre-dispersed in water or an aqueous solvent mixture in the presence of the cationic surfactant and the polyvinyl alcohol. In order to prepare the recording material, the pre-dispersed pigment is then mixed with the diazo compound or the diazonium salt and further polyvinyl alcohol, applied to a support in the form of a thin layer and the layer is dried. In coating mixtures not based on water but on organic solvents, however, the pre-dispersed pigments according to EP-A 738 931 are not stable. They form precipitations or even prove to be completely insoluble.

The pigments which are used in the positive- or negative-working, photosensitive mixture according to EP-A 519 591 are dispersed with acid-modified polyvinyl acetals. The mixture is primarily envisaged for the preparation of colour proofs. It is less suitable for the preparation of printing plates. The plates do not achieve a sufficient print run, and tone-value stability is also poor.

Pigment dispersions and negative-working, photosensitive mixtures produced therewith are disclosed in EP-A 778 497. The pigments are in particular copper phthalocyanines. They are dispersed in a solvent mixture which comprises an aliphatic ($C_1$–$C_8$) alcohol, a ($C_1$–$C_8$) alkylene-glycol-mono- or di-($C_1$–$C_8$) alkyl ether or a cyclic ketone. The dispersion takes place with a polymer, which for its part was obtained by the conversion of a polymer containing a hydroxyl group with a di- or polycarboxylic anhydride in the presence of a tertiary amine acting as a catalyst. Preferred hydroxyl group-containing polymers are those having vinyl alcohol groups. The photosensitive component is a diazonium salt polycondensation product or a combination of a polymerisable compound with a photoinitiator. As a result of the pigment dispersion, the image areas stand out with high contrast from the non-image areas, in which the layer was removed in development. However, in photopolymer systems the pigment dispersions are frequently not sufficiently stable. In addition, they cannot meet the requirements for good solubility in the developer and long print run at the same time. If the print run is sufficient, the solubility in the developer is so low that deposits form and vice-versa.

Dispersions have also long been known which were prepared by mixing a coloured pigment with a polyvinyl acetal in the melt, extruding the melt and then pulverising. The powders obtained can be readily redispersed in alcohols, ketones or ethers. The dispersions also remain stable if alkyl acrylate polymers and monomers as well as initiators are added. However, the pigment dispersions are only poorly soluble in aqueous-alkaline developers. There they very rapidly form tacky, insoluble residues.

Water-dispersible graft polyvinyl acetals and their use as dispersing agents are described in EP-A 482 517. In the graft polyvinyl acetals, polyvinyl alcohols are grafted onto a polyalkylene oxide or polyurethane base. Pigment dispersions prepared therewith can be readily processed in alcoholic and aqueous media and have only a slight tendency towards the formation of insoluble deposits in aqueous-alkaline developers. Printing plates that contain these pigment dispersions in the printing layer, however, show reduced printing stability. The ink-accepting printing layer is worn relatively rapidly, so that only a short print run can be achieved.

Surfactants are frequently added in the dispersion of the pigments. However, pigments have also been developed with which surfactant-free pigment dispersions can be prepared. In EP-A 594 026 vinyl acetal copolymers are disclosed which as well as the monomer units of vinyl acetal also contain units of monomers having alkaline metal, alkaline-earth metal or ammonium sulphonate groups. Their use in photosensitive layers, photoprinting plates or photoresists is also described. Dispersions prepared with these copolymers are stable in aqueous media; on the other hand in non-aqueous media incompatibilities with other constituents of photosensitive mixtures occur more frequently. However, the stability of offset printing plates prepared with these pigment dispersions and their print run are generally not sufficient.

A photoresist mixture with which colour filters for liquid-crystal displays can be produced is disclosed in EP-A 725

285. Besides other constituents, it contains a polymerisable acrylate compound, a photopolymerisation initiator and a coloured pigment, which is dispersed with a polyamine, a polyacrylate, a polyurethane, a polycaprolactam, a long-chain alkyl polyaminoamide, a polyisocyanate and/or a polyester. Layers of this mixture are light-fast, thermally stable, allow high resolution and also adhere well to the substrate. However, they are not suitable for the production of printing plates, as their printing stability is too low.

Therefore, there is still a need for a pigment dispersion that is stable and does not form any deposits during storage. The pigment dispersion is to be evenly distributed in photosensitive mixtures, particularly photopolymerisable mixtures, which are dissolved in organic solvents. In the photosensitive layer to be prepared therewith, the proportion of pigment is to be as high as possible, so that high contrast is achieved. No deposits are to be formed in aqueous-alkaline developers. Furthermore, it is still desirable to find dispersed, metal-free pigments. The used aqueous solutions resulting from the development of recording materials which are prepared with such metal-free, pre-dispersed pigments may then be released into the public sewer. The finished printing plate is finally to permit a long print run.

It has been found that the foregoing objectives can be accomplished by using a mixture of two different polymers for dispersion of the pigment. One of these is a polymer containing polyvinyl alcohol, polyvinyl ether and/or polyvinyl acetal units. It endows the pigment dispersion with stability and has little tendency towards gel formation. The stability is maintained, even if the dispersion is mixed with (further) constituents of photosensitive mixtures. However, this has a less favourable effect in the subsequent printing step. However, the negative effect in the printing layer surprisingly can be compensated for by a second polymer based on acrylate. The said second polymer gives rise to advantageous properties of the layer in printing, in particular high printing stability and a long print run. However, it has a tendency towards gel formation and therefore cannot ensure the stability of the pigment dispersion alone.

According to the invention there is provided a dispersed pigment, which is characterised in that it is dispersed with a mixture of at least one polymer containing polyvinyl alcohol, polyvinyl ether and/or polyvinyl acetal units and at least one polymer based on acrylate. The weight ratio of the two types of polymer is selected so that gel formation is reliably prevented.

The pigment as such is preferably a copper, nickel, tin, titanium, cobalt, lead, manganese and iron phthalocyanine. A metal-free phthalocyanine pigment (Pigment Blue 16, Colour Index No. 74100) is particularly preferred.

The polymer based on acrylate comprises units of monomers of the formula

$$R^1R^2C=CR^3-CO-OR^4 \quad (I)$$

wherein
- $R^1$ and $R^2$ each independently represent a hydrogen atom, a methyl or an ethyl group,
- $R^3$ is a hydrogen atom, a ($C_1$–$C_{10}$) alkyl or a ($C_6$–$C_{10}$) aryl group, and
- $R^4$ is a hydrogen atom, a straight-chained or branched ($C_1$–$C_{10}$)alkyl group, which may be substituted with one or more hydroxyl or ($C_1$–$C_6$) alkoxy group(s), a straight-chain or branched ($C_3$–$C_{10}$) alkenyl, a ($C_4$–$C_7$) cycloalkyl or a ($C_6$–$C_{12}$) aryl group, which may be substituted with a ($C_8$–$C_{12}$) aralkenyl and/or ($C_3$–$C_{10}$) alkenyl group.

$R^3$ is preferably a methyl, ethyl, propyl, butyl, phenyl, [1]naphthyl or [2]naphthyl group. $R^4$ is preferably a methyl, ethyl, 2-hydroxyethyl, propyl, 3-hydroxypropyl, isopropyl, allyl, butyl, isobutyl, sec.-butyl, but-2- or -3-enyl, pentyl, 3-methylbutyl, 3-methylbut-2-enyl, pent-2-, -3- or -4-enyl, hexyl, 2-, 3- or 4-methylpentyl, 2- or 3-ethylbutyl, hex-2-, -3-, -4-, -5-enyl, cyclohexyl, allylphenyl, styryl or 2-, 3- or 4-styrylphenyl group.

The polymer based on acrylate is preferably a co- or terpolymer that contains units from two or three different monomers of formula (I). Particularly preferred are co- and terpolymers which contain units of monomers wherein $R^4$=H besides units of monomers wherein $R^4 \neq H$. A particularly preferred copolymer of this type is for example a methacrylic acid/methyl methacrylate copolymer, while a preferred terpolymer of this type is for example a methacrylic acid/2-hydroxyethyl methacrylate/allyl methacrylate or a methacrylic acid/methyl methacrylate/butyl or hexyl methacrylate terpolymer. The polymer based on acrylate preferably does not contain any units from other monomers apart from the units from monomers of formula (I). However, if such units from other monomers are present, their proportion is generally not more than 50 mol %. Such other monomers are for example styrene, styrene derivatives, maleic anhydride or maleimide.

Said co-, ter- or higher mixed polymers are generally statistically structured, i.e. they are not block copolymers. They generally have an average molecular weight $M_w$ of 1,000 to 1,000,000, preferably of 3,000 to 500,000, more preferably of 5,000 to 200,000.

The polymer containing polyvinyl alcohol, polyvinyl ether and/or polyvinyl acetal units comprises or consists of units of at least one of formulae (II) and (III)

$$-CR^5R^6-CR^7(OR^8)- \quad (II)$$

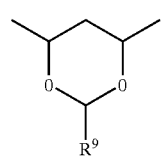

(III)

wherein
- $R^5$ to $R^7$ each independently represent a hydrogen atom or a ($C_1$–$C_4$) alkyl group,
- $R^8$ is a hydrogen atom, a ($C_1$–$C_6$) alkyl group, a ($C_1$–$C_{10}$) alkanoyl, ($C_3$–$C_{10}$) alkenoyl or ($C_3$–$C_{10}$) alkinoyl group, which may be substituted in the end position with a carboxyl group, a group of the formula $-[CHR^{10}-CH_2-O]_m-H$ or $-CH_2-[CHR^{10}-CH_2-O]_o-H$, wherein the residues $R^{10}$ same or different represent a hydrogen atom or a methyl group and m and o represent integers from 1 to 20, or a ($C_7$–$C_{11}$) aroyl group substituted with one or more hydroxyl and/or carboxyl group(s),
- $R^9$ is a hydrogen atom, a ($C_1$–$C_6$) alkyl group or a group of the formula $-[CH_2-CH_2-O]_n-H$, wherein n represents an integer from 1 to 20.

The residues $R^5$ to $R^7$ represent in particular a hydrogen atom, a methyl, ethyl, propyl, isopropyl, butyl, isobutyl and/or sec. butyl group. $R^8$ is preferably a hydrogen atom, a methyl, ethyl, propyl, isopropyl, butyl, isobutyl, sec.-butyl, tert.-butyl, pentyl, 3-methylbutyl, hexyl, 2-, 3- or 4-methylpentyl, formyl, acetyl, propionyl, butyryl, but-2- or 3-enoyl, pentanoyl, pent-3-, -3- or -4-enoyl, hexanoyl, hex- 2-, 3, -4-, -5- or -6-enoyl, heptanoyl, hydroxybenzoyl, dihydroxybenzoyl, trihydroxybenzoyl, carboxyhydroxybenzoyl, dicarboxybenzoyl, tricarboxybenzoyl, carboxy[1]- or [2]naphthoyl, carboxyacetyl, 3-carboxypropionyl, 4-carboxypentanoyl, 3-carboxyacryloyl, 4-carboxybut-2- or -3-enoyl or a carboxypropioloyl group (—CO—C≡C—CO$_2$H).

The polymer containing units of monomers of formulae (II) and/or (III) generally has an average molecular weight $M_w$ of 1,000 to 2,000,000, preferably 3,000 to 1,000,000, more preferably 5,000 to 500,000.

The weight ratio of the polymers containing polyvinyl alcohol, polyvinyl ether and/or polyvinyl acetal units to the polymers based on acrylate is generally 1:10 to 10:1, preferably 4:1 to 1:4, more preferably 2:1 to 1:2.

The preparation of the dispersed pigments according to the invention takes place in a manner known in itself. A two-stage process has proved particularly favourable. In the first stage, the pigments, the binders, the solvents and optionally also the dispersing aids are agitated in an agitating device (for example a turbine agitator or a dissolver) for approximately 15 min to approximately 1 h. Dispersion then takes place in a ball mill using balls having a diameter of approximately 1 mm (balls of glass or ceramic or another hard and inert material showing little abrasion are preferred). This stage takes several hours and where appropriate is carried out several times. Finally the balls used for pulverising are separated by filtration. The weight ratio of pigment to dispersion binder is generally 1:3 to 3:1, preferably 2:1 to 1:2.

The pigment dispersions according to the invention are primarily envisaged as a constituent of the photosensitive layer in recording materials for the preparation of printing plates, especially of planographic printing plates. They are quite particularly suitable for negative-working recording materials comprising a layer of a polymerisable mixture. However, they can also be used in positive-working mixtures (which as photosensitive components contain for example ortho-quinone diazides or a combination of acid-cleavable compounds and compounds which form an acid sufficient for their cleavage under the effect of actinic radiation), in reversible mixtures (positive→negative) or in negative mixtures containing pre-crosslinked diazo resins. The photosensitive recording materials produced therewith can be used among other things for the production of letterpress, gravure and screen printing forms. However, the pre-dispersed pigments can also be used in a large number of other materials. These include photoresist mixtures, hardenable printing inks, hardenable inks for ink-jet printers, coatings of layer transfer materials and electrophotographic toners.

According to the present invention there is also provided a negative-working, photosensitive mixture that contains the pre-dispersed pigments described, as well as a recording material comprising a support and a layer of this mixture.

The photosensitive mixture contains as substantial constituents a) at least one polymer binder which is soluble in organic coating solvents, insoluble in water, but on the other hand is soluble or at least swellable in aqueous-alkaline solutions, b) at least one addition-polymerisable, ethylenically unsaturated compound, c) at least one photopolymerisation initiator and d) at least one of the pigment dispersions according to the invention.

Particularly suitable polymer binders a) are those having carboxyl groups in side positions. These include copolymers containing units of (meth)acrylic acid, crotonic acid or maleic acid semi-ester, but also polymers containing hydroxy, sulpho, phosphono, sulphamoyl or polyalkoxylate groups, some or all of which have reacted with cyclic di- or polycarboxylic anhydrides. The polymer binders generally have an average molecular weight $M_w$ of 500 to 1,000,000, preferably 1,000 to 200,000, and an acid number of 10 to 250, preferably 20 to 200. Co- and mixed polymers of (meth)acrylic acid, crotonic acid and vinylacetic acid are to be mentioned in particular. Alkyl (meth)acrylates, hydroxyalkyl (meth)acrylates, allyl (meth)acrylates and/or (meth)acrylonitrile are particularly suitable as comonomers for the production of co- and mixed polymers. The term "(meth)acrylic acid" is an abbreviation for "acrylic acid and/or methacrylic acid". Corresponding definitions apply to ". . . meth)acrylate", "(meth)acrylonitrile", etc.

Additionally worthy of mention as binders are copolymers of maleic anhydride and styrenes, olefins (in particular α-olefins), vinyl ethers and vinyl esters, which may be substituted. The maleic anhydride groups can also be transformed into esters. The proportion of binders (a) is generally 10 to 90 wt. %, preferably 20 to 80 wt. %, in each case relative to the total weight of the non-volatile constituents of the photosensitive mixture.

The polymerisable compounds b) are generally ethylenically unsaturated compounds, preferably (meth)acrylic esters of divalent or polyvalent alcohols. To be mentioned in particular are ethylene glycol di(meth)acrylate, di-, tri- tetra- or pentaethylene glycol di(meth)acrylate, (meth)acrylates of trimethylol ethane or propane, pentaerythritol, dipentaerythritol or of polyvalent alicyclic alcohols. Reaction products of mono- or diisocyanates with partial esters of polyvalent alcohols can also be used advantageously. Also suitable, finally, are polymerisable compounds that additionally contain photooxidisable groups, optionally also urethane groups. The photooxidisable groups are generally amino, urea or thio groups, which may also be a constituent of heterocyclic rings. Particularly suitable photooxidisable groups are triethanolamino, triphenylamino, thiourea, imidazole, oxazole, thiazole, acetylacetonyl, N-phenylglycine and ascorbic acid groups. Of these polymerisable compounds, those containing primary, secondary or tertiary amino groups are preferred. The proportion of polymerisable compounds (monomers) b) is generally 20 to 90 wt. %, preferably 40 to 80 wt. %, relative in each case to the non-volatile constituents of the photosensitive mixture. The photoinitiator c) can be selected from a range of substance classes. Suitable in particular are derivatives of benzophenone, acetophenone, benzoin, benzil, fluorenone, thioxanthone, acridine or quinazoline as well as of polynuclear quinones. Also worthy of mention are trichloromethyl-s-triazines, 3-halomethyl-5-vinyl-[1,3,4] oxadiazole derivatives, halogen oxazoles substituted with trichloromethyl groups and carbonyl methylene heterocycles containing trihalomethyl groups (as described in DE-A 33 33 450). Also suitable, finally, are alkyl-bis-acyl-phosphine oxides, alkylaryl-bis-acyl-phosphine oxides, titanocenes, ferrocenes, azidosulphonyl phenyl phthalimides, ketoxime ether and onium compounds (in particular diaryliodonium, diazonium or sulphonium compounds). In order to further increase sensitivity, the mixture can additionally contain one or more co-initiator(s). Highly effective, for example, is the combination of titanocenes with trichloromethyl-s-triazines, of titanocenes with ketoxime ethers, of acridines with trichloromethyl-s-triazines, and of titanocenes and ferrocenes. A further increase in sensitivity can be achieved by adding dibenzylideneacetone or amino acid derivatives. The proportion of photoinitiators including any co-initiators present is generally 0.01 to 20.0 wt. %, preferably 0.05 to 10.0 wt. %, in each case relative to the total weight of the non-volatile constituents of the photosensitive mixture.

In order to set particular properties, the mixture may additionally contain inhibitors and controlling substances. These include benzophenone compounds, phosphorus compounds, cycloacetals, quinones, quinolines, naphthoquinones, anthraquinones, ethers, sterically hindered amines, benzothiazoles, thiurams, thiocarbamates, phenols, napththols, benzimidazoles, mercaptobenzimidazoles and phenylenediamines. The proportion of the inhibitors and/or controlling substances is generally 0.001 to 10.0 wt. %, preferably 0.005 to 5.0 wt. %, relative in each case to the total weight of non-volatile constituents of the photosensitive mixture.

The mixture may additionally contain sensitising dyes, which make it sensitive to the wavelength range in which exposure is to take place. These may be in particular photoreducible xanthene, fluorene, benzoxanthene, benzothioxanthene, thiazine, oxazine, coumarin, pyronine, porphyrine, acridine, azo, disazo, cyanine, merocyanine, diarylmethyl, triarylmethyl, anthraquinone, phenylenediamine, benzimidazole, fluorochrome, quinoline, tetrazole, naphthol, benzidine, rhodamine, indigo, spiroborane and/or indanthrene dyes. The proportion of sensitising dyes is generally 0.01 to 15.0 wt. %, preferably 0.05 to 5.0 wt. %, in each case relative to the total weight of the non-volatile constituents of the photosensitive mixture.

The proportion of the pigment dispersion according to the invention is generally 0.5 to 10.0 wt. %, preferably 1.0 to 7.0 wt. %, again relative in each case to the total weight of the non-volatile constituents of the photosensitive mixture.

Besides the pigment dispersions according to the invention, other dyes or pigments may also be present. Useful, for example, are phthalocyanine, rhodamine, triarylmethane, azo, disazo, anthraquinone, naphthol, indanthrone and phenylenediamine dyes and inorganic coloured pigments and pigments such as silicon dioxide, titanium dioxide, aluminium dioxide and special-effect pigments with glossy effects.

Finally the layer may also contain plasticisers, controlling substances, exposure indicators, surface-active and/or wetting agents.

In order to apply the mixture to a substrate, (at least) one suitable organic coating solvent is added to the mixture. Suitable solvents for example are acetone, butanone, cyclohexane, ethyl acetate, tetrahydrofuran, toluene, ethylene glycol monomethyl ether or monoethyl ether, ethylene glycol monomethyl ether acetate, propylene glycol monomethyl ether acetate, propylene glycol monobutyl ether acetate, 3-methoxy-propyl acetate, dimethyl sulphoxide, γ-butyrolactone, N,N-dimethyl formamide, methyl or ethyl lactate and mixtures thereof. The proportion of solids in the coating solutions and dispersions is generally 2 to 35 wt. %, preferably 3 to 20 wt. %, in each case in relation to the total weight of the coating liquid.

Supports (=substrates) suitable for printing forms preferably consist of metal, in particular of aluminium or an aluminium alloy, steel, zinc, copper, metal alloys or metal composites, e.g. bimetallic supports of aluminium and copper. However, they may also consist of plastic, in particular polyethylene terephthalate (PETP), cellulose acetate, polyamide or polyester. Supports for screen printing stencils consist in particular of perlon gauze. The mixture according to the invention can also be used for the preparation of photoresist images in semiconductor production. In this case the support is generally a silicon wafer. The surface of the support in many cases is pre-treated. Aluminium supports may be mechanically, chemically and/or electrochemically roughened, anodically oxidised and/or hydrophilised. The pre-treatment in particular brings about better adhesion of the photosensitive coat to the substrate. In the case of printing plates for wet offset printing, it additionally brings about better water acceptance and better water-retention capacity in the non-image areas (these are the areas in which the support is uncovered upon development). The reflection capacity of the support can also be reduced by the pre-treatment (antihalation). This effect can also be achieved if a layer containing binders, pigments and optionally additives is applied directly to the support.

The coating liquid is applied to the support according to methods which in themselves are known to those skilled in the art. The liquid is applied by curtain coating, spray coating, dip coating, roll coating or in a similar manner. The coating solvent is then largely or completely removed by drying. After drying, the weight of the photosensitive layer is generally approximately 0.5 to 3.0 g/m$^2$, preferably 0.6 to 2.0 g/m$^2$.

An overcoat can additionally be applied to the photosensitive layer, which overcoat is transparent to the radiation acting image-wise. Such a coat usually consists of polymers which are water-soluble or emulsifiable in water, such as polyvinyl alcohol, polyvinylpyrrolidone or other water-soluble polymers. It may additionally contain wetting agents, adhesion promoters, defoamers, dyes or other additives. The weight of the overcoat is typically 0.5 to 5.5 g/m$^2$, preferably 1.0 to 2.5 g/m$^2$.

In order to form an image in the photosensitive layer, the recording material according to the invention may be exposed through a master which carries a corresponding positive or negative image. Particularly suitable for this purpose is light or radiation from fluorescent tubes, pulsed xenon lamps or xenon arc lamps, high-pressure mercury vapour lamps doped with metal halide, and carbon arc lamps. Image-wise exposure can take place in conventional projectors and enlargers, but also by contact imaging (where the master is positioned directly on the recording material). Image-wise exposure is also possible with the coherent light of a laser. The laser beam may be computer-controlled, so that a special exposure mask to generate an image is not necessary. Laser beams with a sufficient energy density are delivered for example by argon ion lasers, krypton ion lasers, dye lasers, solid state lasers, helium-cadmium lasers and helium-neon lasers. The wavelength of the laser beams is generally between 250 and 1100 nm, in particular between 350 and 700 nm.

The image-wise exposed recording materials can then be developed with a conventional aqueous-alkaline solution. The development process can be supported by brushes or other mechanical devices.

The following examples illustrate the present invention in more detail. The designation "wt" represents "part(s) by weight". Percent are percent by weight, unless otherwise stated.

EXAMPLES

The following binders were used:
Binder 1:
The binder was prepared by dissolving 7.8 g of methacrylic acid, 7.8 g of 2-hydroxyethyl methacrylate and 44.4 g of allyl methacrylate were dissolved in 540 g of butanone (=methyl ethyl ketone, MEK). The solution was then heated to 70° C. and 0.82 g of azo-bis-isobutyronitrile (AIBN) was added in two equal portions at an interval of 4 hours. The solution was agitated altogether for 8 hours in a nitrogen atmosphere at this temperature. Cooling to room temperature then took place.

Binder 2:

7.91 g of methacrylic acid and 52.09 g of methyl methacrylate were dissolved in 540 g of MEK and the solution was then heated to 80° C. 1.01 g of AIBN was then added to the heated solution in two equal portions at an interval of 2 hours. After agitating for a total of 5 h in a nitrogen atmosphere, the solution was then cooled to room temperature.

Binder 3:

8.9 g of methacrylic acid, 27.4 g of methyl methacrylate and 23.7 g of hexyl methaxrylate were dissolved in 540 g of MEK and the solution was then heated to 80° C. 0.85 g of AIBN was then added to the heated solution in two equal portions at an interval of 3 hours. After agitating for a total of 6 h in a nitrogen atmosphere, the solution was then cooled to room temperature.

Binder 4:

Polyvinyl butyral (®Mowital B30T from Clariant Deutschland GmbH)

Binder 5:

51 g of polyvinyl butyral (Mowital B30T) and 13.5 g of trimellitic anhydride were dissolved in 269 mg of MEK and brought to reaction in the presence of 1.8 g of triethylamine at 80° C. for 5 hours. The reaction mixture was then cooled to approximately 50° C. and 165 g of γ-butyrolactone was added. It was then further cooled to room temperature with agitation. The solution contains 13% of binder 5.

Binder 6:

75 g of polyvinyl butyral (®Mowital B60T) and 6.75 g of maleic anhydride were dissolved in 506 g of MEK. The solution was then heated to boiling (approximately 80° C.) for 5.5 hours under reflux in the presence of 1.2 g of triethylamine. After cooling to approximately 40° C., 75 g of anhydrous ethanol was added and the solution was cooled to room temperature for a further 30 min while agitating. This solution contains 12.3%. of binder 6.

Preparation of the disperion:

The pigment dispersion in each case was prepared by agitating the components with a turbine agitator or a dissolver at 3,000 to 5,000 revolutions per minute and then dispersing for 4 hours with glass or ceramic balls (diameter approx. 1 mm). The balls were then filtered off. The composition of the various dispersions is shown in Tables 1 and 2.

Example 13

Binder 3 was precipitated in water, filtered, washed and dried. The product obtained was then mixed in the melt with pigment (®Hostaperm B2G from DyStar GmbH & Co. KG, Frankfurt) in the weight ratio 1:1. After cooling, the product was finely ground.

TABLE 1

| Components (in parts by weight) | Examples | | | | | | | | | | | |
|---|---|---|---|---|---|---|---|---|---|---|---|---|
|  | 1 | 2 | 3 | 4 | 5 | 6 | 7 | 8 | 9 | 10 | 11 | 12 |
| Binder 1 | 250 |  |  |  |  |  |  |  |  |  | 125 | 125 |
| Binder 2 |  | 250 |  |  |  |  |  |  | 125 | 125 |  |  |
| Binder 3 |  |  | 250 |  |  |  | 125 | 125 |  |  |  |  |
| Binder 4 |  |  |  | 25 |  |  | 12.5 |  |  |  |  |  |
| Binder 5 |  |  |  |  | 192 |  |  | 96 | 96 |  | 96 |  |
| Binder 6 |  |  |  |  |  | 203 |  |  |  | 101.5 |  | 101.5 |
| Heliogen Blue D 7490* | 25 | 25 | 25 | 25 | 25 | 25 | 25 | 25 | 25 | 25 | 25 | 25 |
| Methoxypropanol | 225 | 225 | 225 | 450 | 283 | 272 | 362.5 | 279 | 279 | 273.5 | 279 | 273.5 |
| Edaplan 10%** |  |  |  |  |  |  |  |  |  |  |  | 0.2 |
| Total solids (%) | 10 | 10 | 10 | 10 | 10 | 10 | 10 | 10 | 10 | 10 | 10 | 10 |
| State of the dispersion after 24 h | 1 | 2 | 3 | + | + | + | + | + | + | + | + | + |

*Cu-free phthalocyanine pigment, Pigment Blue 16, C.I. 74100 (BASF)
**Silicium ethoxylate in methoxypropanol (Münzing)
+ = stable, no change
1 = gel, starting phase-formation
2 = gel, 2 phases
3 = gel, thixotropic, redispersible

TABLE 2

| Components (in parts by weight) | Examples | | | | | | | | | |
|---|---|---|---|---|---|---|---|---|---|---|
|  | 14 | 15 | 16 | 17 | 18 | 19 | 20 | 21 | 22 | 23 |
| Binder 1 |  |  |  |  | 187.2 | 62.5 |  |  |  |  |
| Binder 2 | 187.5 | 150 | 100 | 62.5 |  |  | 125 | 125 | 62.5 | 250 |
| Binder 5 | 48 | 77 | 115 | 144 |  |  | 96 | 96 | 48 | 192 |
| Binder 6 |  |  |  |  | 51 | 152 |  |  |  |  |
| Heliogen Blue D 7490* | 25 | 25 | 25 | 25 | 25 | 25 | 50 | 12.5 | 12.5 | 50 |

TABLE 2-continued

| Components (in parts by weight) | Examples | | | | | | | | | |
|---|---|---|---|---|---|---|---|---|---|---|
| | 14 | 15 | 16 | 17 | 18 | 19 | 20 | 21 | 22 | 23 |
| Methoxypropanol | 239.5 | 248 | 260 | 268.5 | 236.5 | 260.5 | 479 | 266.5 | 377 | 8 |
| Total solids (%) | 10 | 10 | 10 | 10 | 10 | 10 | 10 | 7.5 | 5 | 20 |
| State of the dispersion after 24 h | + | + | + | + | + | + | + | + | + | + |

Preparation of the photosensitive recording materials:

Using pigment dispersions from the preceding examples, coating solutions of the composition stated in Table 3 were prepared which were then applied to a roughened, anodised aluminium support which is pre-treated with a hydrophilising agent. After drying, the photosensitive layer had a weight of approximately 1.8 g/m². A solution of 3.3 wt of polyvinyl alcohol (12% residual acetate content),
1.5 wt of polyvinylpyrrolidone and 0.02 wt of fatty alcohol polyglycol ether,
0.03 wt of tetrasodium salt of ethylenediaminetetraacetic acid, and
94.04 wt of water.

The development itself took place in a VSO 85 processor from Glunz & Jensen. In this equipment the developer solution is sprayed by means of nozzles onto the surface of the recording material and distributed by an oscillating brush. The soluble areas of the coating are rubbed out.

TABLE 3

| Components (in parts by weight) | Examples | | | | | | | | | | | |
|---|---|---|---|---|---|---|---|---|---|---|---|---|
| | 24 | 25 | 26 | 27 | 28 | 29 | 30 | 31 | 32 | 33 | 34 | 35 |
| Binder 1 | 13 | | 13 | | | 13 | | | 13 | | | |
| Binder 2 | | 13 | | 13 | 13 | | 13 | 13 | | 13 | 13 | 13 |
| Dispersion example 1 | 1.0 | | | | | | | | | | | |
| Dispersion example 2 | | 1.0 | | | | | | | | | | |
| Dispersion example 5 | | | 1.0 | 1.0 | | | | | | | | |
| Dispersion example 7 | | | | | 1.0 | | | | | | | |
| Dispersion example 9 | | | | | | 1.0 | 1.0 | | | | | 3.0 |
| Dispersion example 10 | | | | | | | | 1.0 | | | | |
| Dispersion example 13 | | | | | | | | | 0.1 | 0.1 | 0.3 | |
| Monomer 1*** | 10 | 10 | 10 | 10 | 10 | 10 | 10 | 10 | 10 | 10 | 7 | 7 |
| Monomer 2**** | | | | | | | | | | | 0.9 | 0.9 |
| Irgacure 784 | 0.20 | 0.20 | 0.20 | 0.20 | 0.20 | 0.20 | 0.20 | 0.20 | 0.20 | 0.20 | 0.20 | 0.20 |
| Triazine***** | 0.02 | 0.02 | 0.02 | 0.02 | 0.02 | 0.02 | 0.02 | 0.02 | 0.02 | 0.02 | 0.02 | 0.02 |
| Ethyl eosine | 0.20 | 0.20 | 0.20 | 0.20 | 0.20 | 0.20 | 0.20 | 0.20 | 0.20 | 0.20 | 0.20 | 0.20 |
| Methoxypropanol | 35.58 | 35.58 | 35.58 | 35.58 | 35.58 | 35.58 | 35.58 | 35.58 | 35.58 | 35.58 | 37.68 | 37.68 |
| Total solids (in %) | 8.033 | 8.033 | 8.033 | 8.033 | 8.033 | 8.033 | 8.033 | 8.033 | 8.033 | 8.033 | 8.367 | 8.367 |
| Stability of the solution after 48 h | − | — | ++ | ++ | ++ | ++ | ++ | ++ | + | + | + | ++ |

***Monomer according to EP 447 930 - 30% in methyl ethyl ketone
****polyethylene glycol dimethacrylate
*****(bis-trichloromethyl) - (phenylstyryl)-s-triazine 95.0 wt of water was then applied to the photosensitive layer.

After drying, the overcoat had a weight of 2.5 g/m². The recording materials were then exposed image-wise with a ®Agfa Polaris 100 laser imagesetter at a resolution of 1200 dpi with a laser energy of 25 mW.

Development took place with a solution of 1.0 wt of trisodium citrate×2H₂O,
2.0 wt of 2-hydroxypropylamine,
1.4 wt of benzyl alcohol,
1.5 wt of sodium cumenesulphonate
0.04 wt of sodium metasilicate×5H₂O, The recording materials prepared with the coating compositions according to examples 24 to 35 and exposed image-wise were subjected to a development test. After 20 m² unexposed recording material each, an exposed plate was processed in order to check the reproducibility of the development process. The developer was replenished with 30 ml developer per square metre of recording material. Table 4 below indicates for the individual recording materials after how many square metres the developer was exhausted. The developer was regarded as exhausted when residues originating from the photosensitive layer of the recording material congregate into larger particles, which are no longer soluble in the developer and are transferred back by the brushes and rollers of the development machine onto the plates ("redeposition").

TABLE 4

| | Developer exhaustion after m² processed printing plates | | | | | | | | | | | |
|---|---|---|---|---|---|---|---|---|---|---|---|---|
| Example no. | 24 | 25 | 26 | 27 | 28 | 29 | 30 | 31 | 32 | 33 | 34 | 35 |
| m | 85 | 120 | 160 | >200 | 100 | 140 | >200 | 190 | 65 | 60 | 30 | >200 |

In order to test the properties and behaviour of the printing plates, some of the photosensitive recording materials described were comparably exposed image-wise in a ®Polaris 100 computer-to-plate imagesetter from Aga-Gevaert AG, which was equipped with a frequency-doubled Nd:YAG laser emitting at 532 nm (3 steps covered in the step wedge with a density increment ΔD=0.15). After development, the printing plates were mounted on a GTO printing press from Heidelberger Druckmaschinen AG. The maximum print run was regarded as achieved when the tonal value had decreased by more than 5% on a test swatch having a per cent dot area of 40% (tonal value) The results are presented in Table 5.

TABLE 5

| Example no. | 25 | 26 | 27 | 28 | 29 | 30 | 31 | 35 |
|---|---|---|---|---|---|---|---|---|
| Print run (× 1000) | 210 | 80 | 140 | 170 | 130 | >250 | >250 | >250 |

What is claimed is:

1. A photosensitive mixture comprising
   an organic solvent,
   a polymer binder,
   a polymerizable compound,
   a photoinitiator and
   a pigment dispersion which is evenly distributed in said photosensitive mixture
   and which is stabilized with a first polymer and a second polymer
wherein said first polymer contains units of at least one of formulae (II)

$$-CR^5R^6-CR^7(OR^8)- \quad (II)$$

and (III)

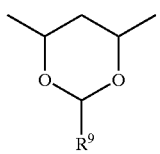

(III)

wherein
   $R^5$ to $R^7$ each independently represent a hydrogen atom or a $(C_1-C_4)$ alkyl group, $R^8$ is a hydrogen atom, a $(C_1-C_6)$ alkyl group, a $(C_1-C_{10})$ alkanoyl, $(C_3-C_{10})$ alkenoyl or $(C_3-C_{10})$ alkinoyl group, which is optionally substituted in the end position with a carboxyl group, a group of the formula $-[CHR^{10}-CH_2O]_m-H$ or $CH_2-[CHR^{10}-CH_2-O]_o-H$, wherein the residues $R^{10}$ are the same or different represent a hydrogen atom or a methyl group and m and O represent integers from 1 to 20, or a $(C_7-C_{11})$ aryl group substituted with one or more hydroxyl or carboxyl group(s),
   $R^9$ is a hydrogen atom, a $(C_1-C_6)$ alkyl group or a group of the formula $-[CH_2-CH_2-O]_n-H$, wherein n represents an integer from 1 to 20,
and wherein said second polymer is a polymer based on acrylate.

2. The photosensitive mixture according to claim 1, wherein the weight ratio of the first polymer to the second polymer is 1:10 to 10:1.

3. The photosensitive mixture according to claim 1, wherein the weight ratio of the first polymer to the second polymer is 4:1 to 1:4.

4. The photosensitive mixture according to claim 1, wherein said first polymer is a polymer mixture containing polyvinyl alcohol, polyvinyl ether, or polyvinyl acetal units or a mixture thereof.

5. The photosensitive mixture according to claim 1, wherein said second polymer comprises units of monomers of the formula $$R^1R^2C=CR^3-CO-OR^4 \quad (I)$$

wherein
   $R^1$ and $R^2$ each independently represent a hydrogen atom, a methyl or an ethyl group,
   $R^3$ is a hydrogen atom, a $(C_1-C_{10})$ alkyl or a $(C_6-C_{10})$ aryl group, and
   $R^4$ is a hydrogen atom, a straight-chain or branched $(C_1-C_{10})$ alkyl group, which is optionally substituted with one or more hydroxyl or $(C_1-C_6)$ alkoxy group(s), a straight-chained or branched $(C_3-C_{10})$ alkenyl, a $(C_4-C_7)$ cycloalkyl or a $(C_6-C_{12})$ aryl group, which is optionally substituted with a $(C_8-C_{12})$ aralkenyl or $(C_3-C_{10})$ alkenyl group or a mixture thereof.

6. The photosensitive mixture according to claim 5, wherein said second polymer is a copolymer or a terpolymer, which contains units from two or three different monomers of the formula (I).

7. The photosensitive mixture according to claim 6, wherein the copolymer and the terpolymer contain units of monomers wherein $R^4$ is H besides units of monomers wherein $R^4$ cannot be H.

8. The photosensitive mixture according to claim 6, wherein the copolymer comprises units of monomers selected from the group consisting of monomers A and B, and wherein the terpolymer comprises units of monomers selected from the group consisting of monomers, A, C and D, or the monomers A, B and E, or of the monomers A, B and F,
wherein A is methacrylic acid,
   B is methyl methacrylate,
   C is 2-hydroxy ethyl methacrylate,
   D is allyl methacrylate,
   E is butyl methacrylate and
   F is hexyl methacrylate.

9. The photosensitive mixture according to claim 1, wherein said first polymer has an average molecular weight $M_w$ of 1,000 to 2,000,000.

10. The photosensitive mixture according to claim 1, wherein said first polymer has an average molecular weight $M_w$ of 3,000 to 1,000,000.

11. The photosensitive mixture according to claim 1, wherein said first polymer has an average molecular weight $M_w$ of 5,000 to 500,0100.

12. The photosensitive mixture according to claim 1, wherein said second polymer has an average molecular weight $M_w$ of 1,000 to 1,000,000.

13. The photosensitive mixture according to claim 1, wherein said second polymer has an average molecular weight $M_w$ of 5,000 to 500,000.

14. The photosensitive mixture according to claim 1, wherein said second polymer has an average molecular weight $M_w$ of 5,000 to 200,000.

15. The photosensitive mixture according to claim 1, wherein said polymer binder is a polymer which is soluble in organic coating solvents, insoluble in water, and is soluble or at least swellable in aqueous-alkaline solutions.

16. The photosensitive mixture according to claim 15, wherein said polymer binder is a polymer which have carboxyl groups in side positions.

17. The photosensitive mixture according to claim 16, wherein said polymer binder is a polymer which contains units of (meth)acrylic acid, crotonic acid or maleic acid semi-ester or a polymer containing hydroxy, sulpho, phosphono, sulphamoyl or polyalkoxylate groups, some or all of which have reacted with cyclic di- or polycarboxylic anhydrides.

18. The photosensitive mixture according to claim 1, wherein the proportion of said polymer binder is 10 to 90 wt. % relative in each case to the total weight of the non-volatile constituents of the photosensitive mixture.

19. The photosensitive mixture according to claim 1, wherein the proportion of said polymer binder is 20 to 80 wt. % relative in each case to the total weight of the non-volatile constituents of the photosensitive mixture.

20. The photosensitive mixture according to claim 1, wherein the proportion of said polymerizable compound is 20 to 90 wt. % relative in each case to the total weight of the non-volatile constituents of the photosensitive mixture.

21. The photosensitive mixture according to claim 1, wherein the proportion of said polymerizable compound is 40 to 80 wt. % relative in each case to the total weight of the non-volatile constituents of the photosensitive mixture.

22. The photosensitive mixture according to claim 1, wherein the proportion of said photoinitiator, including any co-initiator present, is 0.0 to 10.0 wt. % relative in each case to the total weight of the non-volatile constituents of the photosensitive mixture.

23. The photosensitive mixture according to claim 1, wherein the proportion of said photoinitiator, including any co-initiator present, is 0.05 to 10.0 wt. % relative in each case to the total weight of the non-volatile constituents of the photosensitive mixture.

24. The photosensitive mixture according to claim 1, further comprising an aluminum support.

25. The photosensitive mixture according to claim 1, wherein said material is a positive-working, negative-working or reversible working material.

26. A photosensitive recording material obtained by coating the mixture according to claim 1.

* * * * *

UNITED STATES PATENT AND TRADEMARK OFFICE
CERTIFICATE OF CORRECTION

PATENT NO.    : 6,576,396 B1                                        Page 1 of 1
DATED         : June 10, 2003
INVENTOR(S)   : Thomas Leichsenring et al.

It is certified that error appears in the above-identified patent and that said Letters Patent is hereby corrected as shown below:

Column 15,
Line 6, "500,0100." should read -- 500,000. --.

Column 16,
Line 16, "0.0" should read -- 0.01 --.

Signed and Sealed this

Twenty-third Day of September, 2003

JAMES E. ROGAN
*Director of the United States Patent and Trademark Office*